United States Patent [19]

Joist et al.

[11] Patent Number: 4,783,720
[45] Date of Patent: Nov. 8, 1988

[54] PLUG ASSEMBLY

[75] Inventors: H. Michael Joist, Gagenau; Hans-Ulrich Guenther, Straubenhardt, both of Fed. Rep. of Germany

[73] Assignee: Schroff Gesellschaft mit beschränkter Haftung, Straubenhardt, Fed. Rep. of Germany

[21] Appl. No.: 24,194

[22] Filed: Mar. 10, 1987

[30] Foreign Application Priority Data

Mar. 14, 1986 [DE] Fed. Rep. of Germany ... 8607046[U]

[51] Int. Cl.⁴ .............................................. H05K 5/02
[52] U.S. Cl. .................................... 361/399; 361/419
[58] Field of Search .......... 211/41; 361/380, 390–391, 361/395, 399, 415, 429

[56] References Cited

FOREIGN PATENT DOCUMENTS 2145990 3/1973 Fed. Rep. of Germany ...... 361/415
2658775 6/1978 Fed. Rep. of Germany ...... 361/380
1389546 4/1975 United Kingdom .

Primary Examiner—A. D. Pellinen
Assistant Examiner—Gregory D. Thompson
Attorney, Agent, or Firm—Spencer & Frank

[57] ABSTRACT

A plug assembly having a printed circuit board, a face plate and two printed circuit board holders, for introduction into a frame-like structural assembly including bearing rails. The printed circuit board holders being provided with a clamping stand for the printed circuit board, a receiver slot for receiving a face plate, and a flange for attachment to a bearing rail. The improvement being that each printed circuit board holder has a face plate attachment mechanism, at least one rib disposed in the receiver slot and a wall disposed adjacent the receiver slot which contains an opening. The face plate attachment mechanism being disposed in the opening and passing through the receiver slot. The face plate has at least one projection insertable in the receiver slot of one holder.

5 Claims, 2 Drawing Sheets

FIG. 2
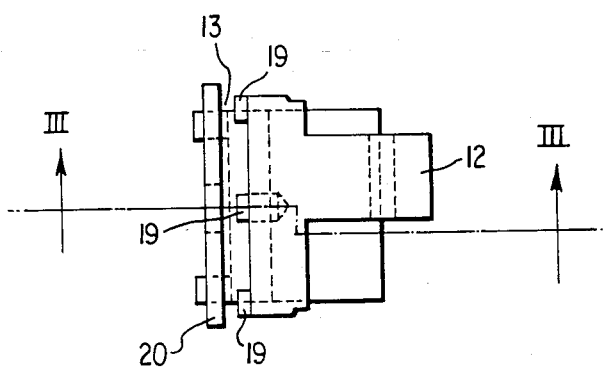
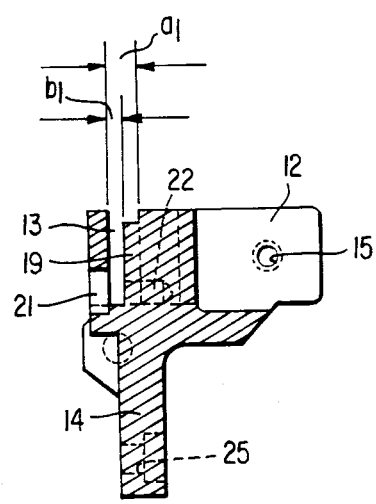
FIG. 3

PLUG ASSEMBLY

BACKGROUND OF THE INVENTION

1. Field of the Invention

The innovation relates to a plug assembly, consisting of a printed circuit board, a face plate and two printed circuit board holders, for introduction into a frame-like structural assembly having bearing rails, in which the printed circuit board holder is provided with a clamping stand for the printed circuit board, with a receiver slot on the face plate, and with a flange for its fastening to the bearing rail.

The innovation can be used in plug assemblies of various dimensions which can be introduced into structural assemblies, such as are often used in the construction of electrical and electronic devices.

2. Discussion of the Prior Art

Plug assemblies of various embodiments are already known. They consist essentially of three structural parts which are fitted to each other, which are a printed circuit board, a face plate standing perpendicular to the printed circuit board, and two printed circuit board holders. These printed circuit board holders both connect the printed circuit board with the face plate and also fasten the plug assembly to the horizontal bearing rails of the structural assembly. The structural parts of the various known systems are only partially interchangeable. It has been found to be a drawback that face plates of different thicknesses cannot be exchanged or replaced one for the other.

SUMMARY OF THE INVENTION

The purpose of the invention is to construct a plug assembly so that face plates of different thicknesses can be used.

This purpose is attained by the disclosure of a three-part plug assembly, in which the printed circuit board holder is provided with a clamping stand, a receiver slot and a flange. At least one rib is located in the receiver slot of the printed circuit board holder. The wall of the receiver slot has a recess in which rests the head of a setscrew passing through the receiver slot, and at least one projection projects on each short side of the face plate. The suggested configuration of the printed circuit board holder allows for connection of the printed circuit board with two face plates of different thicknesses.

According to one other feature of the innovation the clamping stand is arranged off-center. This feature provides for changing the position of the printed circuit board in relation to the face plate, in order to obtain space for the alignment of the printed circuit board.

The clamping stand advantageously has a threaded bore passing through it, which provides the advantage that the printed circuit board can be screwed in as desired on either side of the clamping stand.

BRIEF DESCRIPTION OF THE DRAWINGS

The innovation is to be described in more detail hereinafter in one exemplary embodiment with reference to the attached drawings. The drawings show:

FIG. 2 shows a plan view of the printed circuit board holder of FIG. 1;

FIG. 3 shows a cross sectional view of the printed circuit board holder taken along line III—III of FIG. 2.

DESCRIPTION OF THE PREFERRED EMBODIMENTS

Figure 1:
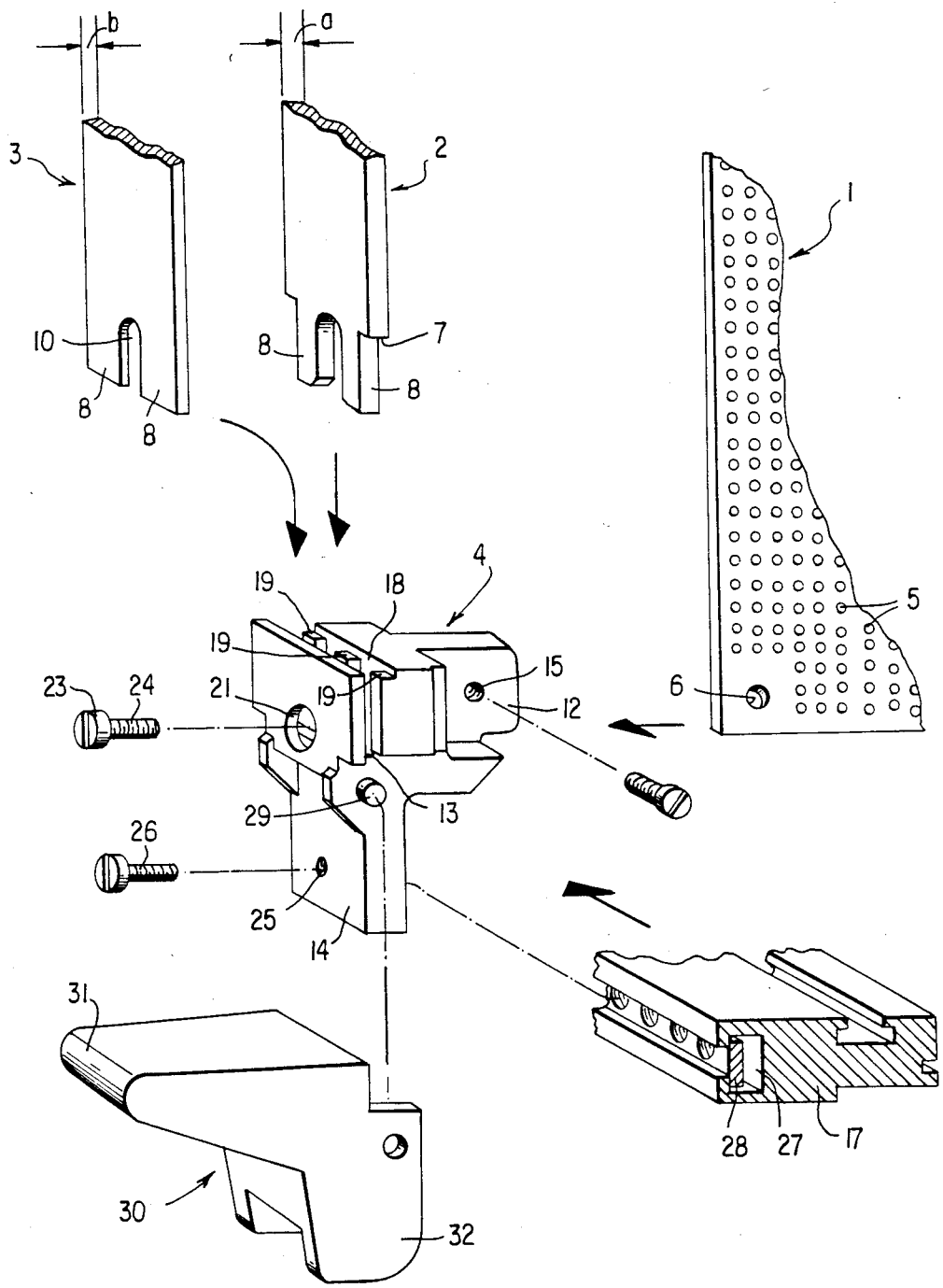
FIG. 1 shows a plug assembly in perspective according to the invention with the individual parts being enlarged to approximately double their actual size.

The plug assembly shown in FIG. 1 consists of three parts, including a printed circuit board 1, a face plate 2 or 3 and a printed circuit board holder 4.

The printed circuit board 1 shown spread out and enlarged consists of insulation material and has a grid of openings 5 for attachment of electrical and electronic structural elements (not shown). In the vicinity of its corner, printed circuit board 1 has an attachment opening 6, which serves for the screw attachment of printed circuit board 1 to printed circuit board holder 4.

Face plate 2 is aluminum and is also shown in detail. It is a rectangular, flat plate, with two parallel projections 8 projecting on both short sides 7. These projections 8 serve for fastening face plate 2 to printed circuit board holder 4. The thickness of this face plate 2 is indicated as "a". The second face plate 3 is likewise rectangular and has only one slot-like recess 10 between two projections 8, and the thickness "b" of this face plate 3 is only approximately half that of face plate 2.

Printed circuit board holder 4 has essentially one clamping stand 12, one receiver slot 13, and one flange 14.

The clamping stand 12 is on the body of printed circuit board holder 4 and is arranged offset from the middle (FIG. 2). A threaded bore 15 passing crosswise through clamping stand 12 allows printed circuit board 1 to be screwed by setscrew 16 into this member as desired on either side of clamping stand 12. It is to be understood that two printed circuit board holders 4 belong to each plug assembly, and printed circuit board 1 together with one face plate 2 or the other face place 3 is fastened to bearing rails 17 of the structural assembly.

Deep receiver slot 13 in printed circuit board holder 4 passes crosswise through the bodies of printed circuit board holder 4 crosswise and serves for the introduction of face plate 2 or 3. Three parallel, short, equidistant ribs 19 are arranged in this receiver slot 13 on the inside wall 18 turned toward the body. The total width "$a_1$" of receiver slot 13 (FIG. 3) is somewhat greater than the thickness "a" of face plate 2, and the small width "$b_1$" of receiver slot 13 reduced by ribs 19 is slightly larger than the thickness "b" of face plate 3. The arrangement is such that following mounting of the front edges of both face plates 2 and 3 they stand in the same plane. The spacing between two adjacent ribs 19 is slightly greater than the width of the two projections 8 on face plates 2 and 3 to allow the projections 8 to be inserted between ribs 19.

The wall 20 of receiver slot 13 has a circular opening 21, aligned with a threaded bore 22 (FIG. 3) provided in the body of holder 4. The head 23 of a setscrew 24 fits in this opening 21, passing through receiver slot 13 and screwing into threaded bore 22. Either face plate 2 thrust into receiver slot 13 or face plate 3 fastened to printed circuit board holder 4 is fastened as desired by means of setscrew 24.

On the body of printed circuit board holder 4 flat flange 14 projects downward, and has a through-hole 25. A screw 26 screws printed circuit board holder 4 onto bearing rail 17, and for this purpose a threaded strip 28, bottom right, FIG. 1, provided with a series of screw threads, lies in a groove 27.

Two cylindrical journals 29 project to the sides below receiver slot 13 of printed circuit board holder 4. A plastic ejector 30 is pivotably arranged in both of these journals 29. This ejector 30 is configured as a toggle lever, connected through one or more multiple plug connections with the structural assembly, and can be easily removed. When the longer toggle lever 31 is moved downward, then the shorter lever 32 engages against the front of bearing rail 17.

What is claimed is:

1. In a plug assembly having a printed circuit board, a face plate and two printed circuit board holders, for introduction into a frame-like structural assembly including bearing rails, at least one of said circuit board holders being provided with a clamping stand for the printed circuit board, a receiver slot for receiving a face plate, and a flange for attachment to at least one of the bearing rails, the improvement wherein:

said one printed circuit board holder having a face plate attachment means, at least one rib disposed in said receiver slot and a wall disposed adjacent said receiver slot which contains an opening, said face plate attachment means being disposed in said opening and passing through said receiver slot for attaching said face plate to said one printed board holder; and said face plate has at least one projection insertable in said receiver slot of said one printed board holder.

2. A plug assembly as defined in claim 5, wherein said one printed circuit board holder includes two side surfaces, and said clamping stand being disposed closer to one of said side surfaces than to the other of said side surfaces.

3. A plug assembly as defined in claim 6, wherein said clamping stand includes a threaded bore disposed therein.

4. A plug assembly as defined in claim 5, wherein said clamping stand includes a threaded bore disposed therein.

5. A plug assembly as defined in claim 5, wherein said face plate attachment means is a setscrew.

* * * * *